(12) United States Patent
Hu et al.

(10) Patent No.: US 9,812,444 B2
(45) Date of Patent: Nov. 7, 2017

(54) FIN-TYPE RESISTOR

(71) Applicant: Taiwan Semiconductor Manufacturing Co., Ltd., Hsinchu (TW)

(72) Inventors: Chia-Hsin Hu, Changhua (TW); Hsueh-Shih Fan, Hsinchu (TW); Huan-Tsung Huang, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 15/592,256

(22) Filed: May 11, 2017

(65) Prior Publication Data

US 2017/0263602 A1 Sep. 14, 2017

Related U.S. Application Data

(62) Division of application No. 15/068,068, filed on Mar. 11, 2016, now Pat. No. 9,691,758.

(51) Int. Cl.
| | |
|---|---|
| *H01L 29/66* | (2006.01) |
| *H01L 27/06* | (2006.01) |
| *H01L 49/02* | (2006.01) |
| *H01L 29/78* | (2006.01) |
| *H01L 23/535* | (2006.01) |
| *H01L 21/768* | (2006.01) |
| *H01L 29/161* | (2006.01) |

(52) U.S. Cl.
CPC .... *H01L 27/0629* (2013.01); *H01L 21/76895* (2013.01); *H01L 23/535* (2013.01); *H01L 28/20* (2013.01); *H01L 29/161* (2013.01); *H01L 29/66166* (2013.01); *H01L 29/66795* (2013.01); *H01L 29/785* (2013.01)

(58) Field of Classification Search
CPC ........ H01L 21/02532; H01L 21/02634; H01L 21/2053; H01L 21/823431; H01L 27/0629; H01L 27/0886; H01L 28/20; H01L 29/161; H01L 29/66545; H01L 29/66166; H01L 29/66795; H01L 29/6681; H01L 29/785; H01L 2029/7858
See application file for complete search history.

(56) References Cited

U.S. PATENT DOCUMENTS

| | | | | |
|---|---|---|---|---|
| 6,720,231 B2* | 4/2004 | Fried | ............. | H01L 27/0802 257/722 |
| 2013/0307076 A1* | 11/2013 | Cheng | ............. | H01L 21/845 257/350 |
| 2016/0087026 A1* | 3/2016 | Kang | ............. | H01L 27/0629 257/379 |

* cited by examiner

*Primary Examiner* — Stephen W Smoot
(74) *Attorney, Agent, or Firm* — Sterne, Kessler, Goldstein & Fox P.L.L.C.

(57) ABSTRACT

A semiconductor device and method for fabricating such a device are presented. The semiconductor device includes a fin extending away from a substrate, a plurality of epitaxially grown regions disposed along a top surface of the fin, and at least two contacts that provide electrical contact to the fin. The plurality of epitaxially grown regions are arranged to alternate with regions having no epitaxial material grown on the top surface of the fin. A resistance exists between the two contacts that is at least partially based on the arrangement of the plurality of epitaxially grown regions.

20 Claims, 12 Drawing Sheets

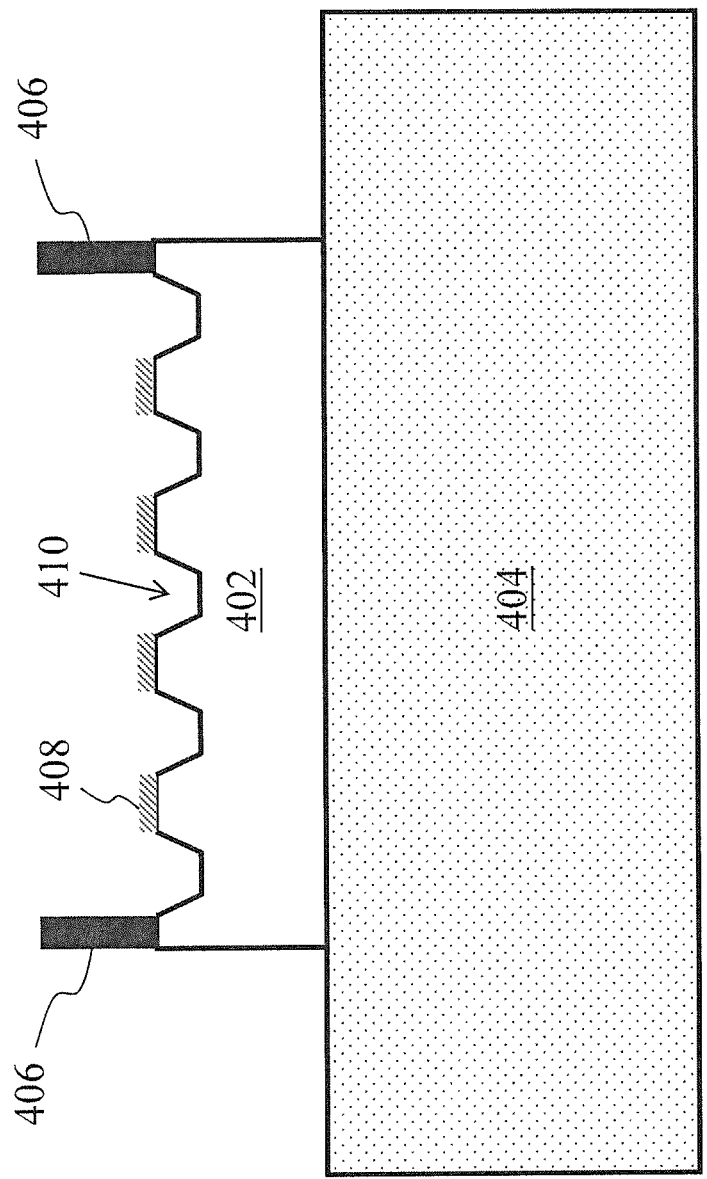

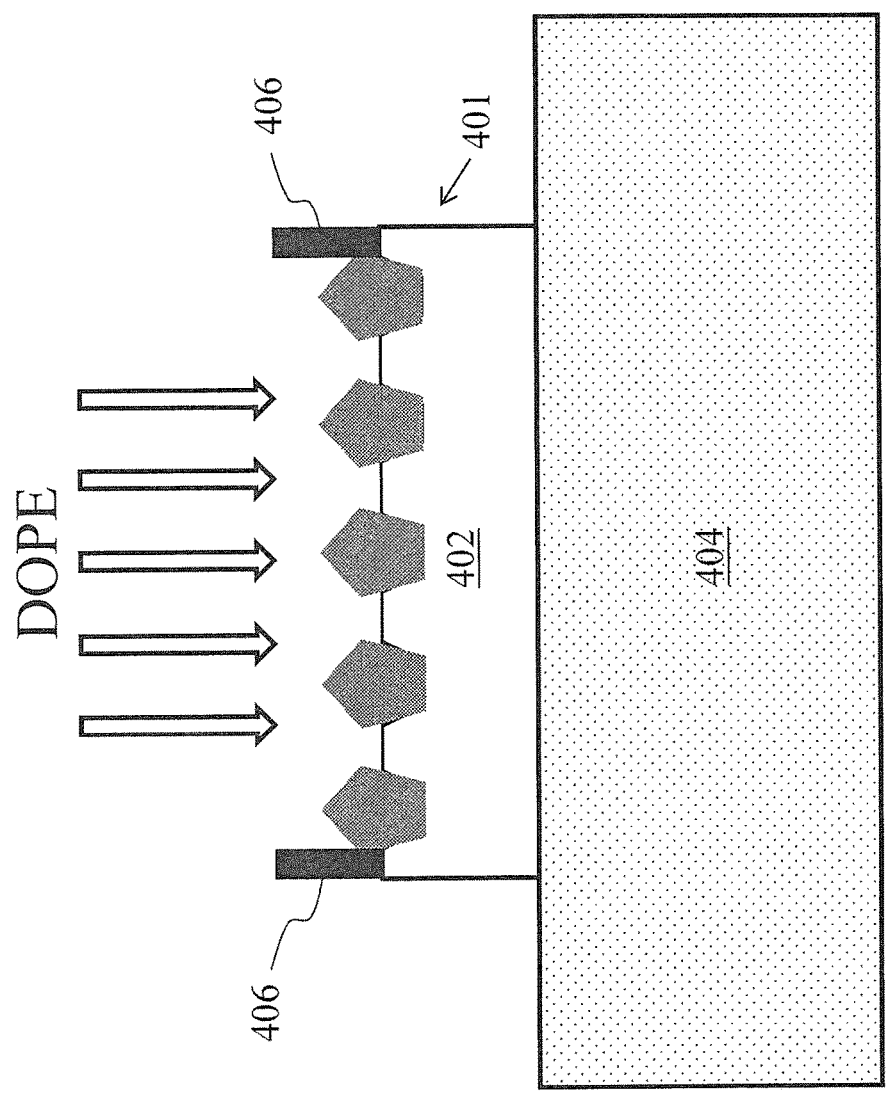

FIN-TYPE RESISTOR

CROSS-REFERENCE TO RELATED APPLICATIONS

This application is a division of U.S. patent application Ser. No. 15/068,068, filed on Mar. 11, 2016, now U.S. Pat. No. 9,691,758, the disclosure of which is incorporated by reference herein in its entirety.

BACKGROUND

Resistors may be fabricated on the same substrate as field effect transistors (FETs) as part of the same integrated circuit. The resistors commonly include two contacts spaced apart with a doped semiconducting material between the contacts. The doping concentration and type, and geometry of the contacts, including their distance apart, all play a role in determining the resistance of the resistor. Achieving very low resistance levels is challenging due to certain fabrication constraints.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4G are fabrication process flow diagrams for a fin-type resistor, according to an embodiment.

DETAILED DESCRIPTION

Figure 1:
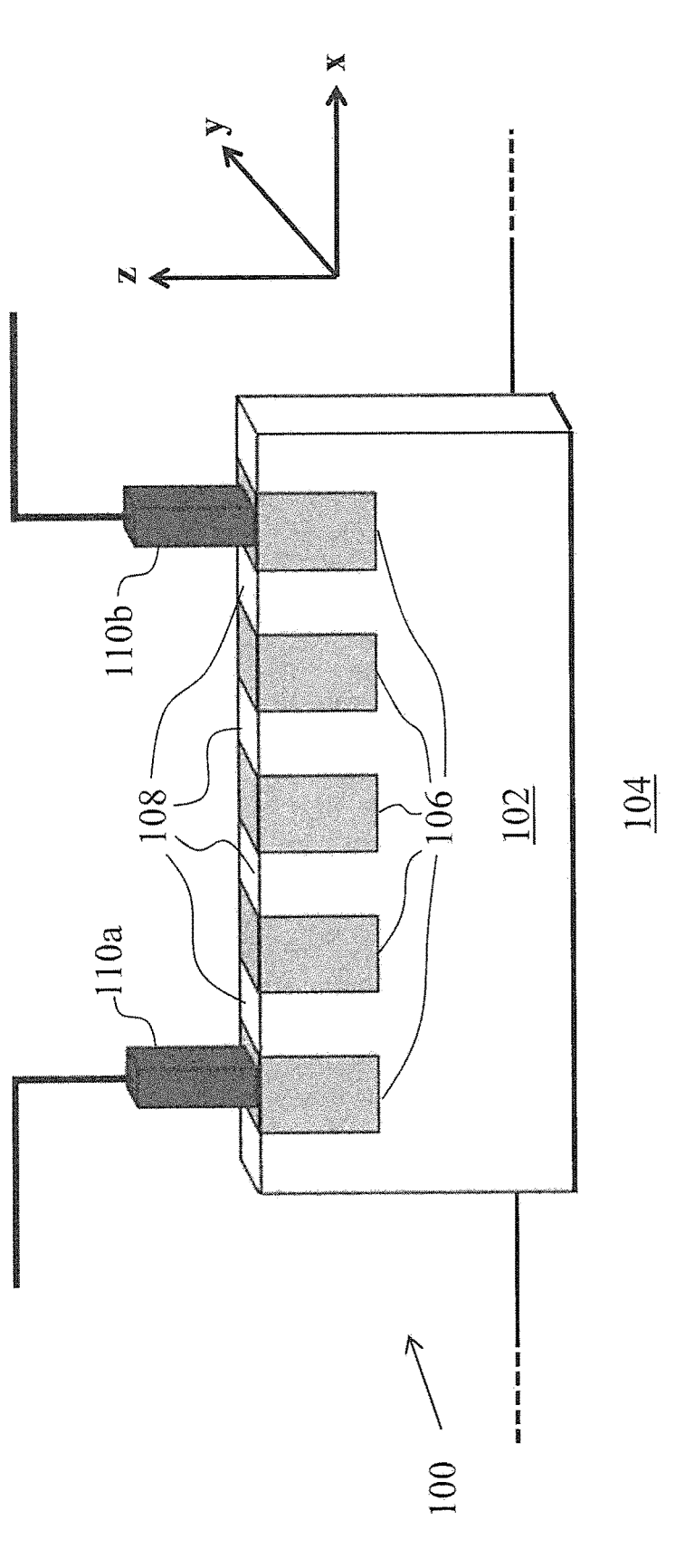
FIG. 1 is a perspective view of a fin-type resistor, according to an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The acronym "FET," as used herein, refers to a field effect transistor. A very common type of FET is the metal oxide semiconductor field effect transistor (MOSFET). Historically, MOSFETs have been planar structures built in and on the planar surface of a substrate such as a semiconductor wafer. But recent advances in semiconductor manufacturing have resulted in the use vertical structures.

The term "finFET" refers to a FET that is formed over a fin that is vertically oriented with respect to the planar surface of a wafer.

The expression "epitaxial layer" herein refers to a layer or structure of single crystal material. Likewise, the expression "epitaxially grown" herein refers to a layer or structure of single crystal material.

The term "contact" refers to a structure for electrical connection of conductors from different interconnect levels. These terms are sometimes used in the art to describe both an opening in an insulator in which the structure will be completed, and the completed structure itself. For purposes of this disclosure "contact" refers to the completed structure, and "contact hole" refers to the opening in one or more insulating layers in which the structure, i.e., the contact, is fouled.

Overview

Various embodiments in accordance with this disclosure provide a design for a resistor fabricated in a fin structure. The fin structure may be a semiconductor material that extends vertically away from the surface of a substrate. Contacts are formed to make electrical contact with the fin structure and form the contacts of the resistor.

In some embodiments, these resistors involve making contact to some form of epitaxially grown material. The resistance of the resistor is dependent on the geometry of the epitaxial layer. It can be difficult to control the growth of the epitaxial material, which results in poor control of the resistance. One possibility is to make contact to very small areas of epitaxially grown material to limit the growth variability, but this limits what resistance values can be achieved.

To affect the overall resistivity of the structure, some regions of the fin structure are etched away and subsequently filled with epitaxially grown material, according to an embodiment. The fin-type resistor described in the embodiments herein has greater process control over the final resistance, and is well suited for integration with standard finFET processing steps. An integrated circuit may include both finFET devices and resistors on the same substrate.

FIG. 1 is a perspective view of a fin-type resistor 100, according to an embodiment. Fin-type resistor 100 is formed within a fin 102 extending away from a substrate 104. Substrate 104 may be a silicon substrate. Alternatively, substrate 104 may comprise another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In an embodiment, the substrate 104 is a semiconductor on insulator (SOI).

Fin 102 and substrate 104 may be the same material, e.g., doped silicon. Fin 102 and substrate 104 may have the same dopant type (i.e., n-type dopants or p-type dopants) In another example, fin 102 includes n-type dopants while substrate 104 includes p-type dopants or vice-versa. Examples of n-type dopants include phosphorus and arsenic, while examples of p-type dopants include boron and indium. Substrate 104 may be etched to form fin 102 using any well-known etching technique such as reactive ion etching or wet silicon etching. In another example, fin 102 is etched from an epitaxially grown or vapor deposited semiconductor layer over substrate 104.

Fin 102 includes alternating regions along its top surface that include regions of epitaxially grown material 106 and exposed fin regions 108. The number of epitaxially grown material regions 106 may vary and is not intended to be limited by the illustration. Similarly, the number of exposed fin regions 108 may vary and is not intended to be limited by the illustration. Further details regarding the fabrication of the alternating regions is found in FIGS. 4A-4G.

Fin-type resistor 100 also includes at least two contacts 110a and 110b, according to an embodiment. In an embodiment, contact 110a makes electrical contact to fin 102 near one end (along the x direction) of fin 102 while contact 110b makes electrical contact to fin 102 near the opposite end (along the x direction) of fin 102. A resistance exists between the two contacts that is at least partially based on the arrangement of epitaxially grown regions 106. The resistance of a material can generally be found from the following equation:

$$R = \rho \frac{L}{A} \quad (1)$$

Where ρ is the resistivity of the material, L is the length of the material between the two contacts, and A is the cross-sectional area of the material between the two contacts. Thus, the material properties and size of epitaxially grown material regions 106 and exposed fin regions 108 at least partially determine the overall resistance of the resistor. Resistors formed in accordance with the embodiments described herein may have a much smaller resistance compared to prior designs. For example, resistances on the order of around 100 ohms/sq. may be achieved with the fin-type resistor design described herein. Additionally, the constrained growth of epitaxial material results in less variation between resistor structures.

Epitaxially grown material regions 106 may include silicon germanium (SiGe). The SiGe may be doped using boron (SiGeB). Other examples of epitaxially grown material regions 106 include silicon carbide (SiC), phosphorus-doped silicon (SiP), or phosphorus-doped silicon carbide (SiCP.)

Although only two contacts are illustrated, any number of contacts may be formed over the top surface, or any side surfaces, of fin 102. In one embodiment, each contact 110a and 110b physically contacts an epitaxially grown material region 106.

Figure 2:
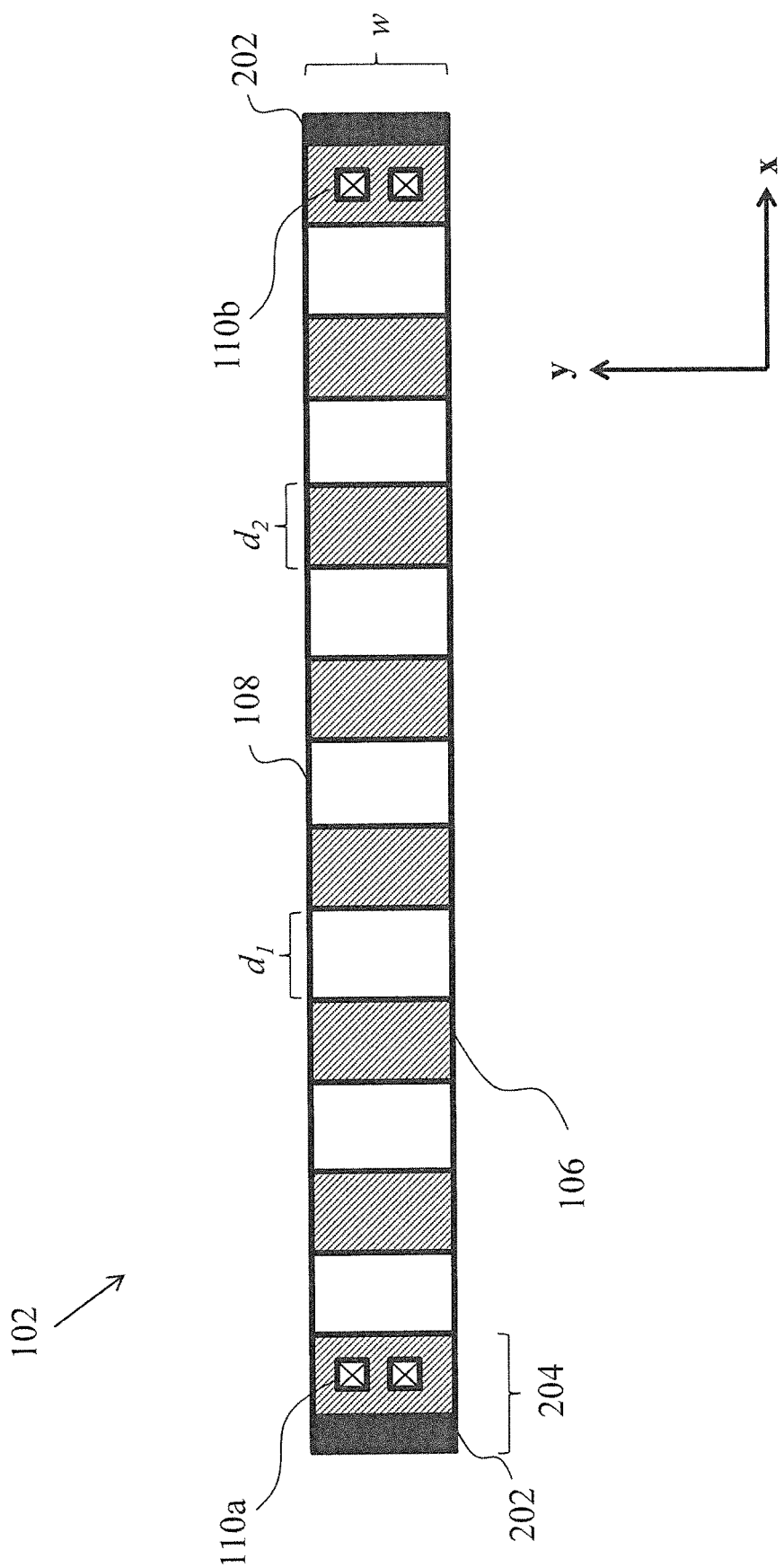
FIG. 2 is a top-down view of the fin-type resistor, according to an embodiment.

FIG. 2 is a top-down view of fin 102, according to an embodiment. FIG. 2 illustrates the same alternating pattern of epitaxially grown material regions 106 and exposed fin regions 108. Contacts 110a and 110b are also shown making physical contact with epitaxially grown material regions 106.

According to an embodiment, fin 102 includes post structures 202 patterned at opposite ends of fin 102. Post structures 202 may be utilized to confine a section of fin 102 that includes the alternating epitaxially grown material regions 106 and exposed fin regions 108. In one example, contacts 110a and 110b are formed adjacent to post structures 202, as illustrated in FIG. 2. Any number of post structures 202 may be patterned. In one embodiment, post 202 and its neighboring contact form a termination structure 204. Termination structure 204 may be repeated at either or both ends of fin 102, such that multiple contacts and post structures 202 are patterned at the ends of fin 102. In an embodiment, post structures 202 are polysilicon. In an embodiment, post structures 202 are formed from the same gate material used to form transistor gates of finFET devices that exist on the same substrate. Post structures 202 may include sidewall structures similar to those that would be patterned on the sidewalls of the transistor gates of the finFET devices.

Dimensions of various features of fin 102 are indicated in FIG. 2. A width w of fin 102 may be between about 5 nm and about 5000 nm. A length $d_1$ of an exposed fin region 108 along the x-direction may be between about 10 nm and about 1000 nm. A length $d_2$ of an epitaxially grown material region 106 along the x-direction may be between about 50 nm and 500 nm. These dimensions are only exemplary, and other dimensions may be used as well.

Figure 3:
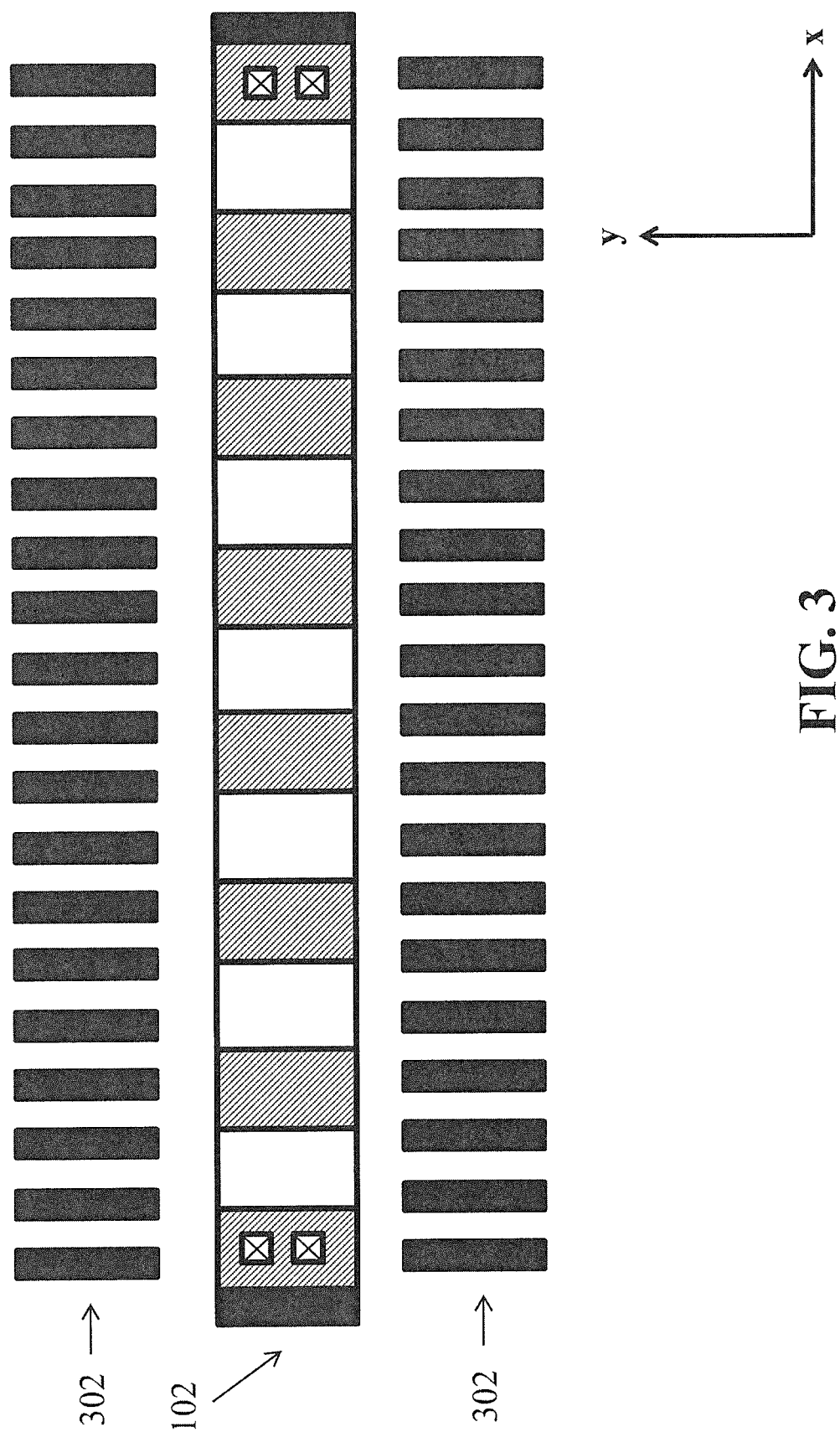
FIG. 3 is another top-down view of the fin-type resistor with dummy structures, according to an embodiment.

FIG. 3 is another top-down view of fin 102 that includes a series of dummy structures 302, according to an embodiment. The term "dummy structure" describes a structure that makes no electrical connection with any other structures on the substrate or with any contacts. Dummy structures 302 may be the same material as post structures 202. In one embodiment, dummy structures 302 are patterned at the same time as post structures 202. Dummy structures 302 may be arranged adjacent to fin 102 on the substrate surface. Any number of dummy structures 302 may be used. Dummy structures 302 may be provided to reduce adverse loading effects caused when performing certain etching or polishing steps during fabrication of the fin-type resistor.

Figure 4A:
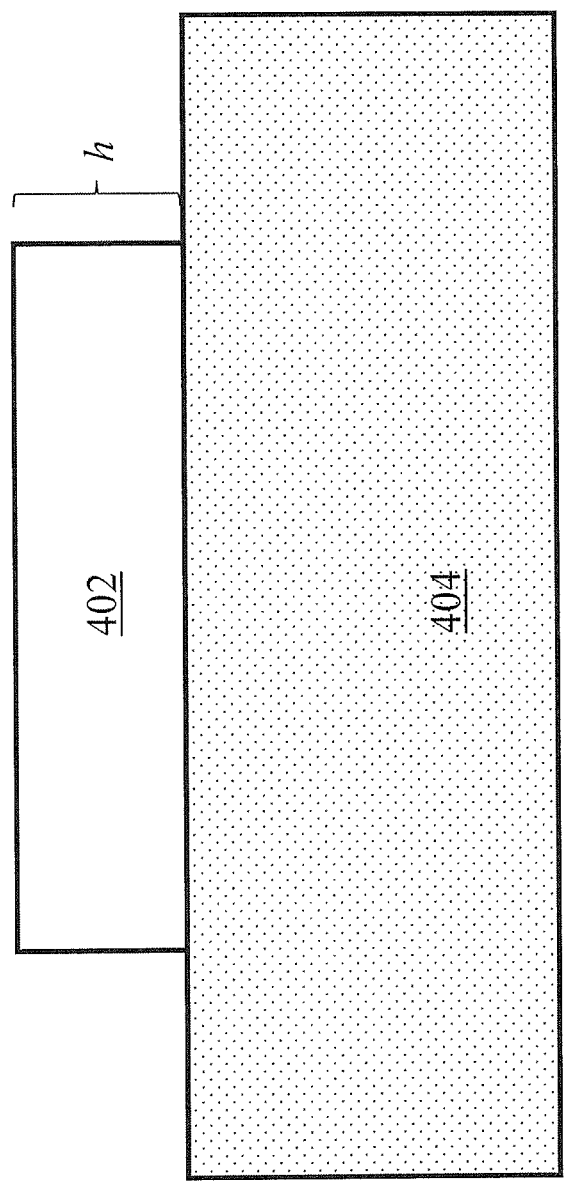

FIGS. 4A-3G illustrate an example process flow for fabricating fin-type resistor 100, according to an embodiment. It should be understood that other fabrication steps not illustrated may also be performed.

FIG. 4A illustrates the formation of fin 402 over substrate 404, according to an embodiment. Fin 402 may be formed via anisotropic etching of substrate 404. Fin 402 and substrate 404 may both be the same semiconductor material with the same dopant type (n-type or p-type). In another embodiment, fin 402 and substrate 404 have different dopant types. In the embodiment where fin 402 and substrate 404 have the same dopant type, isolating structures may be used to electrically isolate the resistor from other devices patterned on substrate 404. These isolating structures may include shallow trench isolation (STI), or oppositely doped regions in substrate 404 to create a p-n junction. A portion of substrate 402 beneath fin 402 may be a well region having a dopant type different from a dopant type of the rest of substrate 402. The height h of fin 402 may range from about 25 nm to about 80 nm.

Figure 4B:
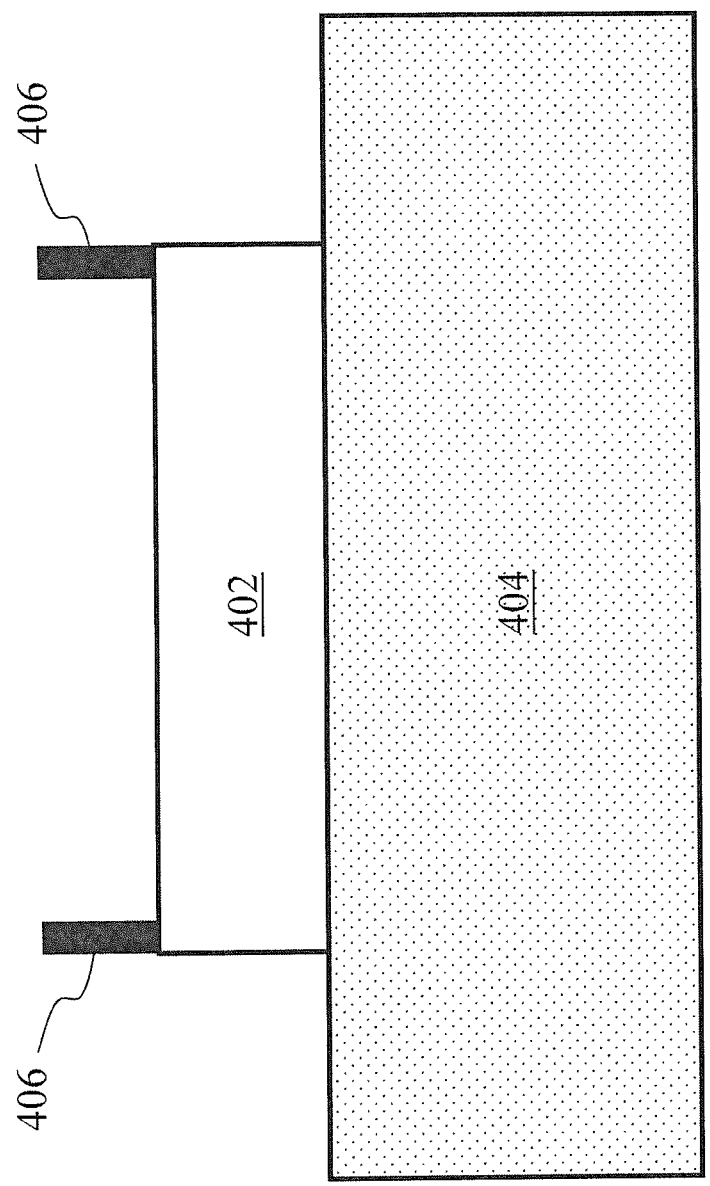

FIG. 4B illustrates the formation of post structures 406, according to an embodiment. Post structures 406 may be polysilicon. In an embodiment, post structures 202 are formed from the same gate material used to form gates of transistor devices that exist on the same substrate. Post structures 406 may be patterned during the same patterning step that forms the gates of the other transistors on substrate 404. These other transistors may include finFET devices, such as those described in U.S. Pat. No. 8,877,592. It should be understood that the inclusion of post structures 406 is optional.

Post structures 406 may be patterned using any standard photolithography techniques. For example, a polysilicon layer may be deposited followed by a photoresist that is patterned to open up areas in the photoresist and expose the polysilicon layer. The exposed polysilicon areas are then etched away to leave behind patterned areas of polysilicon, such as post structures 406. Post structures 406 may be patterned such that they align at the edge of, or at least within 200 nm of, the etched ends of fin 402. In some embodiments, a dielectric layer (not shown) exists between fin 402 and post structures 406. The dielectric layer may be silicon dioxide, or a high-k dielectric material.

Figure 4C:
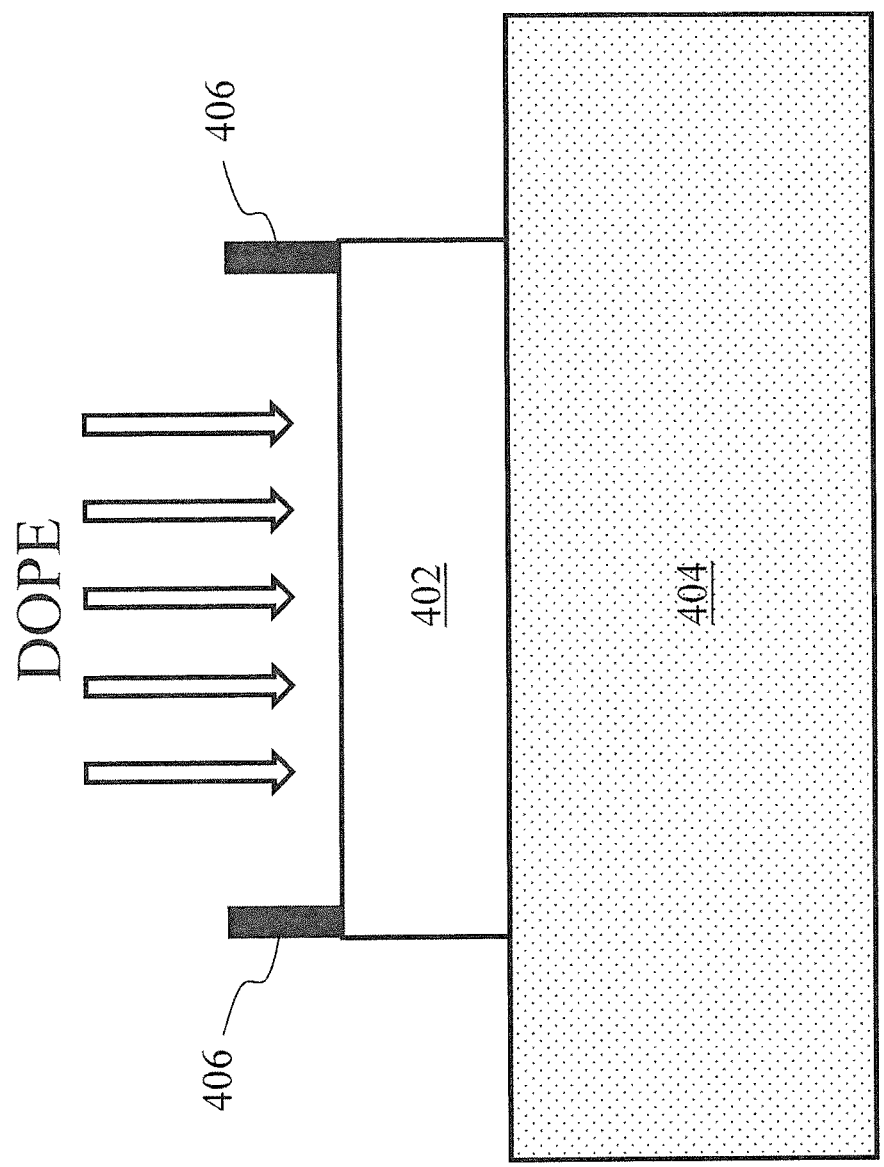

FIG. 4C illustrates a first doping operation performed on fin 402, according to an embodiment. The doping may be n-type or p-type, and reduces the overall resistivity of fin 402. According to an embodiment, the doping performed at this stage is the same doping used to create a lightly doped drain (LDD) for other transistors on substrate 404.

FIG. 4D illustrates a patterning procedure for the top surface of fin 402, according to an embodiment. First, a masking layer is deposited and patterned such that the top surface of fin 402 includes regions covered by masking structures 408 alternating with regions 410 not covered by masking structures 408. Masking structures 408 may be any known hard mask material, such as silicon nitride. Standard photolithography techniques may be used for patterning the masking layer.

Following the formation of masking structures 408, regions 410 are etched, according to an embodiment. The etching may be an isotropic or anisotropic etch. The depth of the etch may vary and will affect the final resistance of the resistor. In an embodiment, the depth of the etch is between about 25 nm and about 100 nm. Reactive ion etching may be used to perform the etch. Xenon difluoride gas may also be used. In other examples, a wet etching chemistry is used to etch fin 402.

Figure 4E:
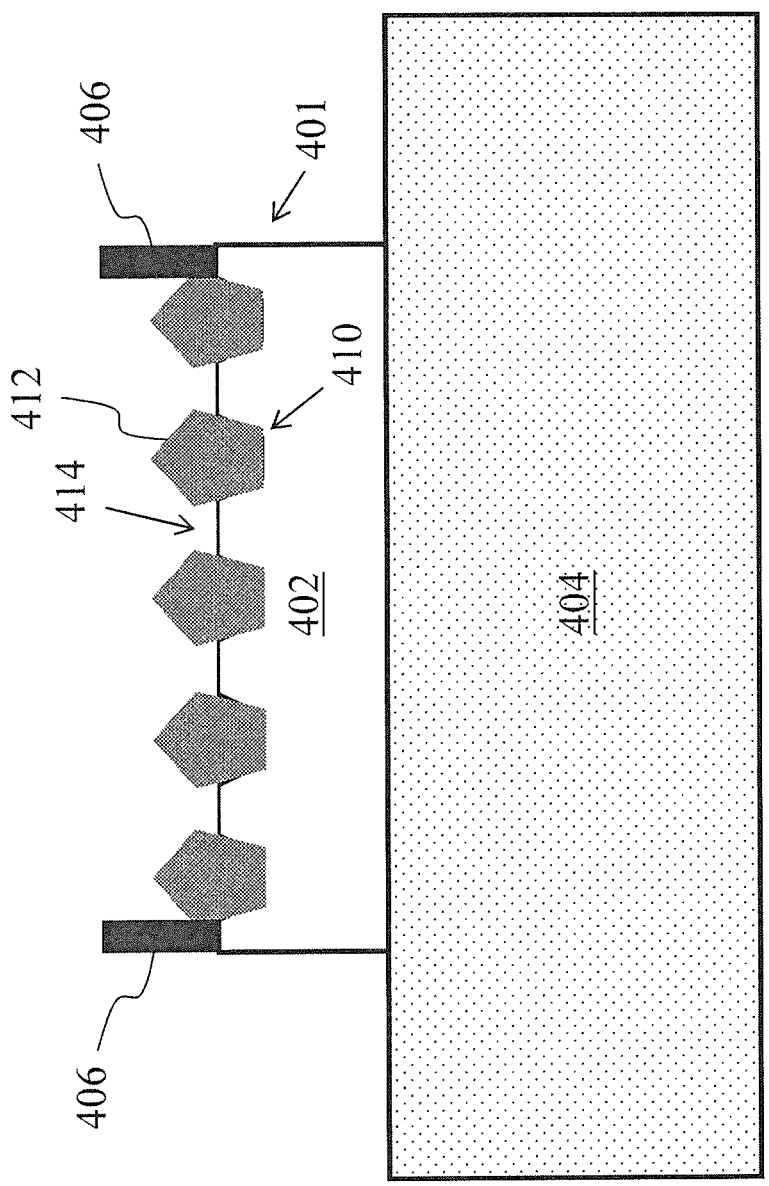

FIG. 4E illustrates the growth of epitaxial material 412 within regions 410, according to an embodiment. Epitaxial material 412 may be silicon germanium that is grown from exposed silicon within regions 410. After the growth of epitaxial material 412, the masking layer is removed to form exposed fin regions 414 between regions having epitaxial material 412, according to an embodiment. The final shape of grown epitaxial material 412 may vary and is based on a variety of factors including material composition, growth rate, and the geometry of regions 410. In an embodiment, epitaxial material 412 is grown directly adjacent to post structures 406.

In one embodiment, epitaxial material 412 is the same material used to form source and drain regions for other finFET devices on substrate 404. Epitaxial material 412 may be grown at the same time as the epitaxial material that defines the source and drain regions of the other finFET devices.

The arrangement of epitaxial material 412 on the top surface of fin 402 affects the resistance of resistor structure 401. Resistor structure 401 includes all active regions of the resistor (e.g., fin 402 and epitaxial material 412.) Any number of regions of epitaxial material 412 may be defined with various spacing between each region. In one example, the spacing between each region of epitaxial material 412 is substantially the same.

FIG. 4F illustrates a second doping operation performed on fin 402 and on epitaxial material 412, according to an embodiment. The doping may be n-type or p-type, and further reduces the overall resistivity of resistor structure 401. According to an embodiment, the doping performed at this stage is the same doping used to dope the source and drain regions of other transistors on substrate 404.

Figure 4G:
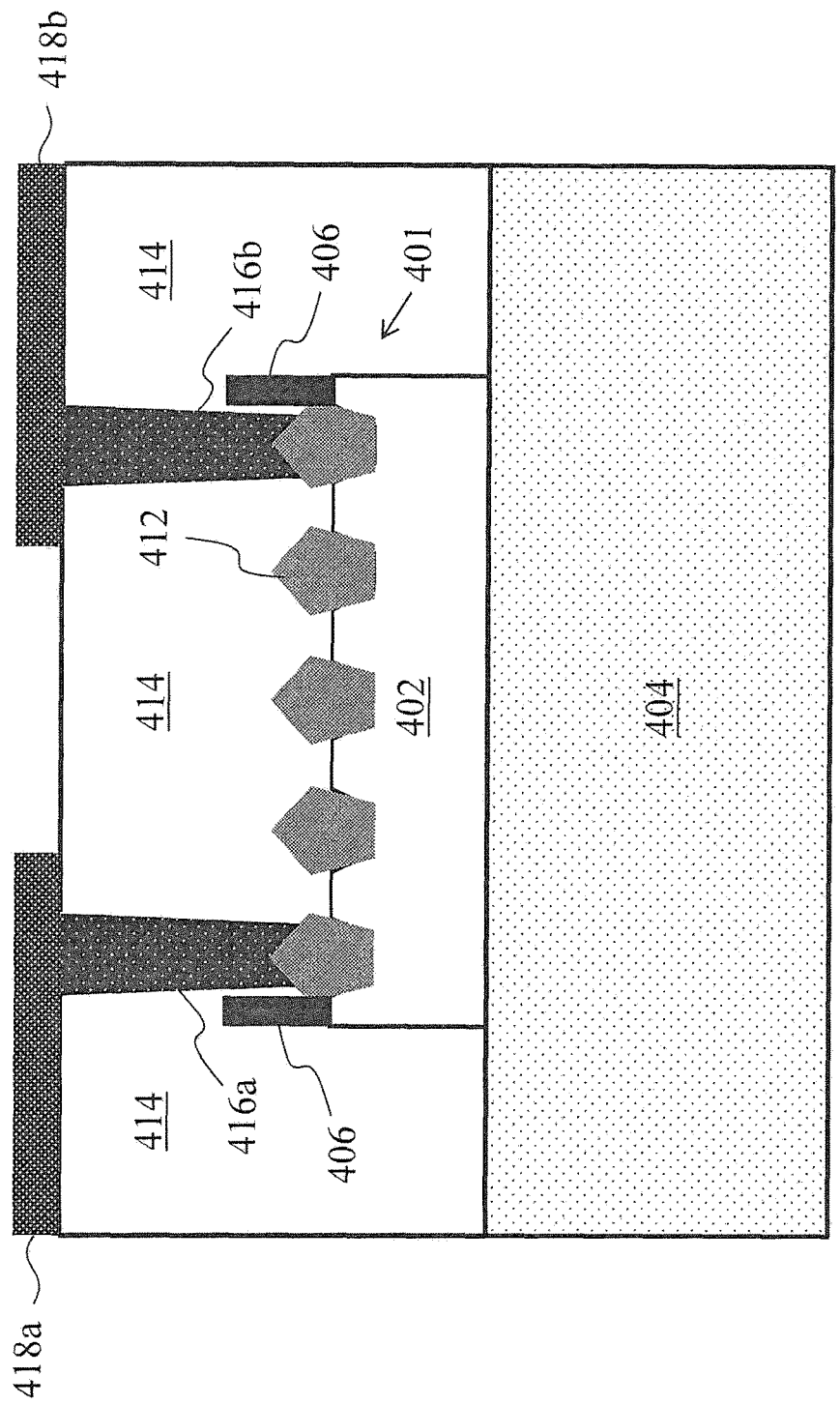

FIG. 4G illustrates the formation of contacts 416a and 416b to make electrical contact with resistor structure 401, according to an embodiment. Contacts 416a/416b may be formed within holes etched through an insulating layer 414. Briefly, insulating layer 414 is first deposited over substrate 404 and fin 402 at a thickness that is at least greater than a height that post structures 406 extend away from a surface of substrate 404. Insulating layer 414 may be any insulative material. In one example, insulating layer 414 is silicon nitride.

Insulating layer 414 is polished using, for example, chemical mechanical polishing (CMP) to form a substantially flat top surface. Insulating layer is then etched to form contact holes leading down to resistor structure 401. The contact holes are filled with a conductive material to form contacts 416a and 416b. In one embodiment, the conductive material of contacts 416a and 416b is tungsten.

In an embodiment, contacts 416a and 416b make physical contact with regions of epitaxial material 412. These regions may be adjacent to post structures 406 at opposite ends of resistor structure 401. After formation of the conductive material to form contacts 416a and 416b, the conductive material may be polished back to create a substantially flat surface once again along the top of insulating layer 414. Metal lines 418a and 418b may then be patterned to make electrical connection with contact 416a and 416b, respectively.

Figure 5:
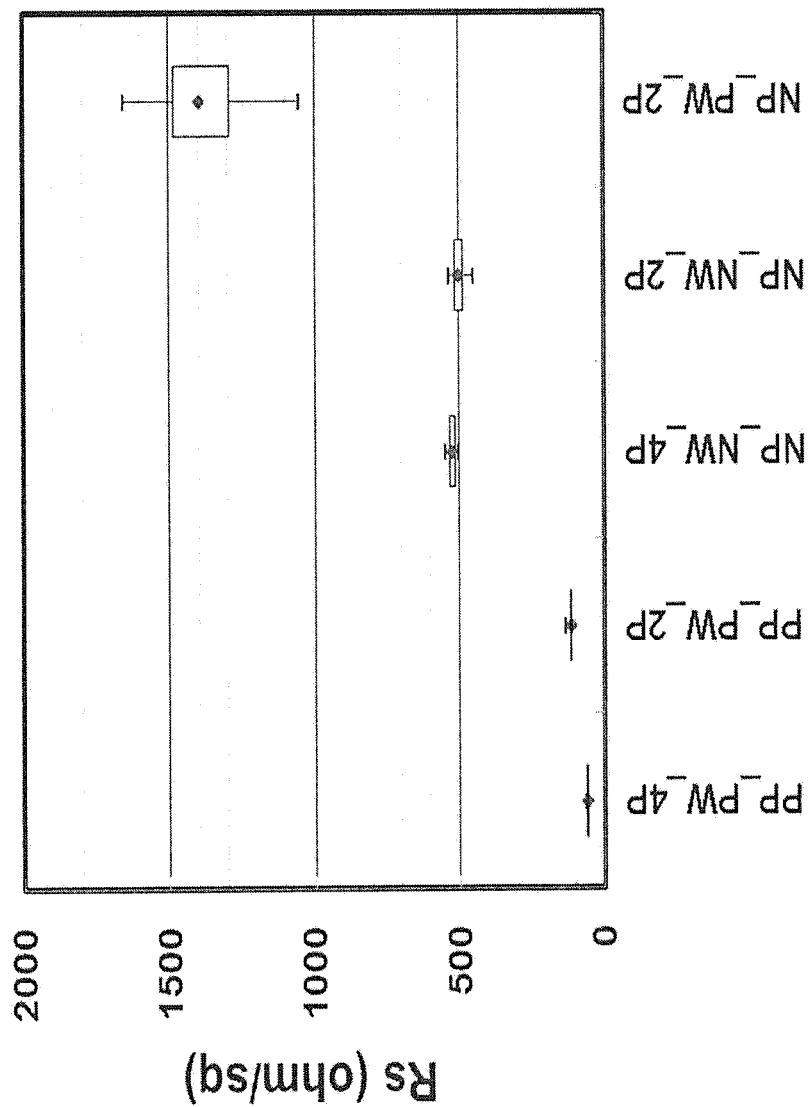
FIG. 5 is a graph of measured resistance data.

FIG. 5 is a graph illustrating measured resistances for various fin-type resistor structures, according to some embodiments. The X-axis lists different fin-type resistors and their measurement method. For example, PP_PW_4P represents a four-point probe measurement of a p-type fin over a p-well region in the substrate; PP_PW_2P represents a two-probe measurement of a p-type fin over a p-well region in the substrate; NP_NW_4P represents a four-point probe measurement of a n-type fin over a n-well region in the substrate; NP_NW_2P represents a two-probe measurement of a n-type fin over a n-well region in the substrate; and NP_PW_2P represents a two-probe measurement of a n-type fin over a p-well region in the substrate.

As can be seen from the graph, the variation is very small amongst resistors formed using p-type dopants over a p-well or n-type dopants over a n-well. Additionally, the measured resistance is around 100 Ohms/sq. for the p-type resistors and around 500 Ohms/sq. for the n-type resistors. Greater variation and a higher measured resistance is observed for the fin-type structure that uses different dopant types for the fin (n-type) and the underlying substrate (p-type).

Figure 6:
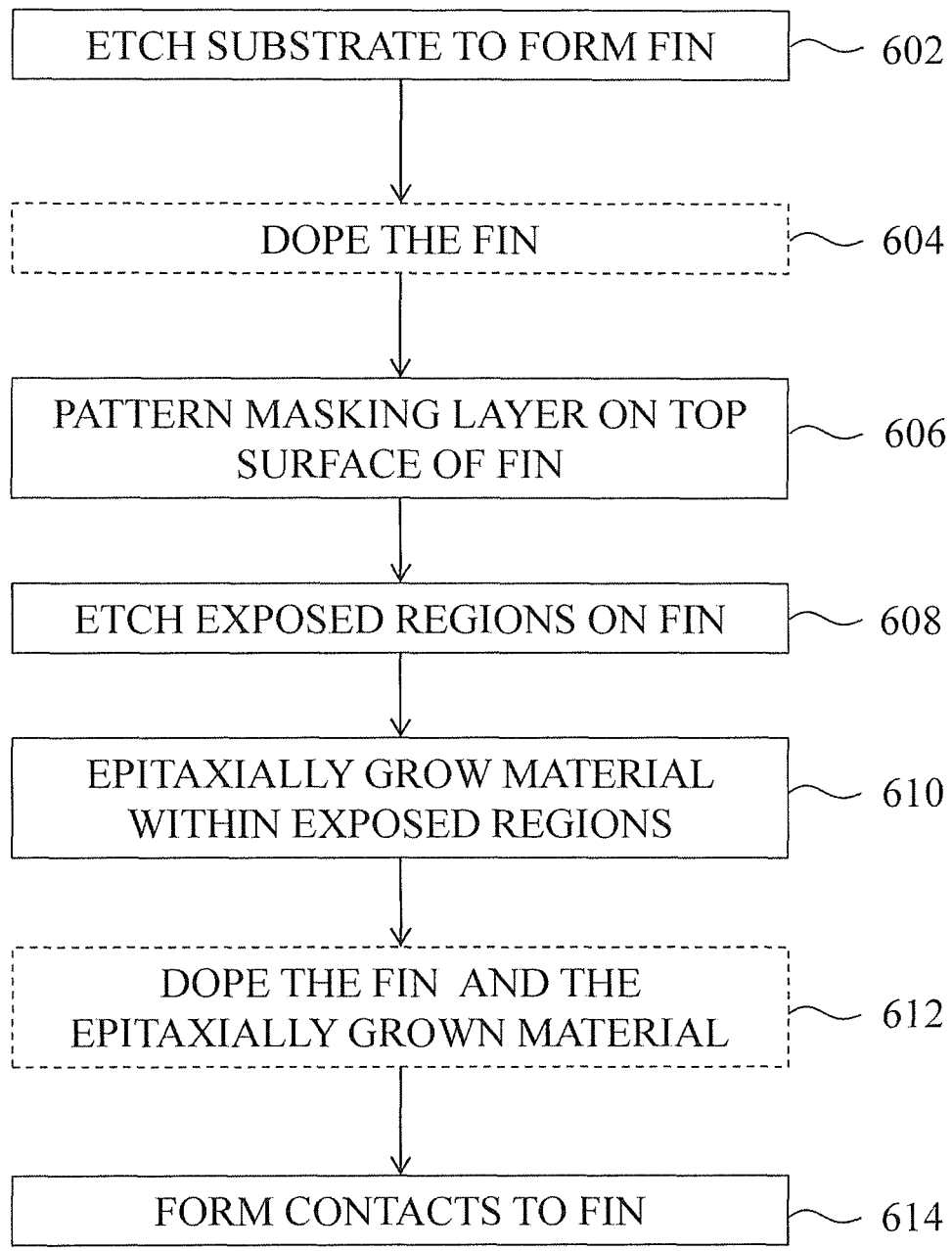
FIG. 6 is a flow diagram of an example method, according to an embodiment.

FIG. 6 is a flow diagram of an illustrative method 600, in accordance with an embodiment, of forming a semiconductor device, such as fin-type resistor 100. Other fabrication steps may be performed between the various operations of method 600, and are omitted merely for clarity.

Method 600 begins at operation 602 where a substrate is etched to form a fin. The fin and the substrate may both be the same semiconductor material with the same dopant type (n-type or p-type). In another embodiment, the fin and the substrate are each different material layers and thus may have different dopant types. In yet another embodiment, the substrate is a silicon-on-insulator (SOI) substrate where the fin is formed in a silicon layer over an insulating layer (e.g., silicon oxide.)

Method 600 continues with operation 604 where the fin is doped. Operation 604 is illustrated with dashed lines to indicate that it is optional and not required for the fabrication of the resistor. According to an embodiment, the doping performed at this stage is the same doping used to create a lightly doped drain (LDD) for transistors on the substrate.

Method 600 continues with operation 606 where a masking layer is patterned on the top surface of the fin to form masking structures. The masking layer may be patterned such that the top surface of the fin includes regions covered by the masking structures alternating with regions not covered by the masking structures. The masking layer may be any known hard mask material, such as silicon nitride. Standard photolithography techniques may be used for patterning the masking layer.

Method 600 continues with operation 608 where exposed regions not covered by the masking structures are etched on the top surface of the fin. The etching may be isotropic or anisotropic, and the depth of the etch may affect the final resistance of the fin-type resistor.

Method 600 continues with operation 610 where a material is epitaxially grown within the exposed etched regions on the top surface of the fin. The epitaxially grown material may be silicon germanium, and its arrangement on the top surface of the fin affects the overall resistance of the structure, according to an embodiment. After the growth of the epitaxially grown material, the masking structures may be removed. Formation of the epitaxially grown material on the fin may coincide with the formation of epitaxial material that defines the source and drain regions of transistors on the substrate.

Method 600 continues with operation 612 where a second doping procedure takes place to dope the fin and the epitaxially grown material. Operation 612 is illustrated with dashed lines to indicate that it is optional and not required for the fabrication of the resistor. According to an embodiment, the doping performed at this stage is the same doping used to dope the source and drain regions of transistors on the substrate.

Method 600 continues with operation 614 where contacts are formed to make electrical connection with the fin-type resistor. The contacts include a conductive material, such as tungsten, and extend through an insulating layer deposited over the fin-type resistor. In an embodiment, the contacts make physical contact with regions of epitaxially grown material on the top of the fin.

In one embodiment, a semiconductor device includes a fin extending away from a substrate, a plurality of epitaxially grown regions disposed along a top surface of the fin, and at least two contacts that provide electrical contact to the fin. The plurality of epitaxially grown regions are arranged to alternate with regions having no epitaxial material grown on the top surface of the fin. A resistance exists between the two contacts that is at least partially on the arrangement of the plurality of epitaxially grown regions.

The semiconductor device may further include two post structures disposed on the top surface of the fin. The plurality of epitaxially grown regions may be arranged between the two post structures.

In another embodiment, a method of fabricating a semiconductor device includes etching a substrate to form a fin extending away from the substrate. The method also includes patterning a masking layer over a top surface of the fin, such that exposed regions of the top surface of the fin alternate with regions covered by the masking layer. The exposed regions of the top surface of the fin are etched and a material is epitaxially grown within the exposed regions on the top surface of the fin. The method also includes forming contacts to make electrical contact to the fin. A resistance exists between the contacts that is at least partially based on an arrangement of the epitaxially grown material on the top surface of the fin.

In yet another embodiment, an integrated circuit includes a plurality of field effect devices and at least one resistor on a substrate. The field effect devices may include finFETs. The resistor includes a fin extending away from a substrate, a plurality of epitaxially grown regions disposed along a top surface of the fin, and at least two contacts that provide electrical contact to the fin. The plurality of epitaxially grown regions are arranged to alternate with regions having no epitaxial material grown on the top surface of the fin. A resistance exists between the two contacts that is at least partially on the arrangement of the plurality of epitaxially grown regions.

It is to be appreciated that the Detailed Description section, and not the Abstract of the Disclosure section, is intended to be used to interpret the claims. The Abstract section may set forth one or more but not all exemplary embodiments of the present invention as contemplated by the inventor(s), and thus, is not intended to limit the present invention and the appended claims in any way.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A device, comprising:
   a fin extending away from a substrate, the fin comprising a semiconducting material;
   a plurality of epitaxially grown regions disposed along a top surface of the fin, wherein the plurality of epitaxially grown regions are arranged to alternate with regions having no epitaxial material grown on the top surface of the fin; and
   at least two contacts configured to provide electrical contact to the fin, wherein a resistance exists between the two contacts that is at least partially based on the arrangement of the plurality of epitaxially grown regions.

2. The device of claim 1, further comprising two post structures disposed on the top surface of the fin, wherein the plurality of epitaxially grown regions are arranged between the two post structures.

3. The device of claim 2, wherein the two post structures comprise polysilicon.

4. The device of claim 1, wherein the fin extends away from a well region in the substrate, and wherein the fin includes n-type dopants and the well region includes p-type dopants.

5. The device of claim 1, wherein the fin extends away from a well region in the substrate, and wherein the fin includes p-type dopants and the well region includes n-type dopants.

6. The device of claim 1, wherein the fin extends away from a well region in the substrate, and wherein the fin and the well region both include either n-type dopants or p-type dopants.

7. The device of claim 1, wherein the at least two contacts physically contact epitaxially grown regions from the plurality of epitaxially grown regions.

8. The device of claim 1, wherein the fin comprises silicon and the plurality of epitaxially grown regions comprise silicon germanium.

9. The device of claim 1, further comprising a plurality of dummy structures arranged on the substrate surface and adjacent to the fin.

10. An integrated circuit, comprising:
a plurality of field effect transistors on a substrate; and
a resistor on the substrate, the resistor comprising:
  a fin extending away from the substrate, the fin comprising a semiconducting material,
  a plurality of epitaxially grown regions disposed along a top surface of the fin, wherein the plurality of epitaxially grown regions are arranged to alternate with regions having no epitaxial material grown on the top surface of the fin, and
  at least two contacts configured to provide electrical contact to the fin, wherein a resistance exists between the two contacts that is at least partially based on the arrangement of the plurality of epitaxially grown regions.

11. The integrated circuit of claim 10, wherein the resistor further comprises two post structures disposed on the top surface of the fin, wherein the plurality of epitaxially grown regions are arranged between the two post structures.

12. The integrated circuit of claim 11, wherein the two post structures comprise polysilicon.

13. The integrated circuit of claim 10, wherein the fin of the resistor extends away from a well region in the substrate, and wherein the fin includes n-type dopants and the well region includes p-type dopants.

14. The integrated circuit of claim 10, wherein the fin of the resistor extends away from a well region in the substrate, and wherein the fin includes p-type dopants and the well region includes n-type dopants.

15. The integrated circuit of claim 10, wherein the at least two contacts of the resistor physically contact epitaxially grown regions from the plurality of epitaxially grown regions.

16. The integrated circuit of claim 10, further comprising a plurality of dummy structures arranged on the substrate surface and adjacent to the resistor.

17. A device, comprising:
a fin extending away from a substrate, the fin comprising a semiconducting material;
a plurality of epitaxially grown regions disposed along a top surface of the fin, wherein the plurality of epitaxially grown regions are arranged to alternate with regions having no epitaxial material grown on the top surface of the fin; and
at least two contacts configured to physically contact epitaxially grown regions from the plurality of epitaxially grown regions.

18. The device of claim 17, further comprising two post structures disposed on the top surface of the fin, wherein the plurality of epitaxially grown regions are arranged between the two post structures.

19. The device of claim 18, wherein the two post structures comprise polysilicon.

20. The device of claim 17, further comprising a plurality of dummy structures arranged on the substrate surface and adjacent to the fin.

* * * * *